United States Patent
Platzer et al.

(10) Patent No.: US 6,861,196 B2
(45) Date of Patent: Mar. 1, 2005

(54) PHOTOSENSITIVE COMPOSITIONS HAVING MIXTURES OF ALKOXY AND NON-ALKOXY DIAZONIUM SALT CONTAINING COMPOUNDS

(75) Inventors: Stephan J. Platzer, Longmeadow, MA (US); Maria T. Sypek, Belchertown, MA (US); Paul Perron, Springfield, MA (US); Harald Baumann, Osterode am Harz (DE); Melinda Alden, Chicopee, MA (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 10/664,179

(22) Filed: Sep. 17, 2003

(65) Prior Publication Data

US 2004/0063022 A1 Apr. 1, 2004

Related U.S. Application Data

(63) Continuation of application No. 09/904,205, filed on Jul. 12, 2001, now Pat. No. 6,638,679.

(51) Int. Cl.$^7$ ............................. G03F 7/30; G03F 7/021
(52) U.S. Cl. ....................... 430/168; 430/157; 430/175; 430/176; 430/270.1; 430/302
(58) Field of Search ................................ 430/168, 157, 430/175, 176, 270.1, 302

(56) References Cited

U.S. PATENT DOCUMENTS

| | | | |
|---|---|---|---|
| 3,406,159 A | 10/1968 | Steppan et al. | |
| 3,849,392 A | 11/1974 | Steppan | |
| 3,867,147 A | 2/1975 | Teuscher | |
| 4,186,017 A | 1/1980 | Palmer | |
| 4,408,532 A | 10/1983 | Incremona | |
| 4,533,620 A | 8/1985 | Walls et al. | |
| 5,714,300 A | 2/1998 | Vermeersch et al. | |
| 5,741,619 A | 4/1998 | Aoshima et al. | |
| 5,846,685 A | 12/1998 | Pappas et al. | |
| 5,919,601 A | 7/1999 | Nguyen et al. | |
| 5,998,084 A | 12/1999 | Elsaesser et al. | |
| 6,638,679 B2 * | 10/2003 | Platzer et al. | ............... 430/157 |

FOREIGN PATENT DOCUMENTS

| | | |
|---|---|---|
| EP | 0 896 251 A1 | 2/1999 |
| EP | 0 902 325 A2 | 3/1999 |
| JP | 02-277695 A | 11/1990 |

* cited by examiner

*Primary Examiner*—John S. Chu
(74) *Attorney, Agent, or Firm*—Faegre & Benson LLP

(57) ABSTRACT

The present invention includes an imageable element, which can be: (a) an imageable element comprising an imaging layer which comprises: an aromatic diazonium salt containing compound having an alkoxy substituent and an aromatic diazonium salt containing compound free of an alkoxy substituent; a polyvinyl acetal binder; and a sheet substrate; or (b) an imageable element comprising an imaging layer which comprises: an aromatic diazonium salt containing compound having an alkoxy substituent and an aromatic diazonium salt containing compound free of an alkoxy substituent; and a sheet substrate. The imaging layer includes a total aromatic diazonium salt containing compound content of at least 10 weight percent. The molar ratio of the aromatic diazonium salt containing compound having an alkoxy substituent to the aromatic diazonium salt containing compound that is free of an alkoxy substituent is from about 1.0:1 to 70:1. Upon imagewise exposure and development, an imaged element is obtained.

27 Claims, No Drawings

PHOTOSENSITIVE COMPOSITIONS HAVING MIXTURES OF ALKOXY AND NON-ALKOXY DIAZONIUM SALT CONTAINING COMPOUNDS

RELATED APPLICATIONS

This application is a continuation of U.S. application Ser. No. 09/904,205, filed Jul. 12, 2001, now U.S. Pat. No. 6,638,679.

BACKGROUND OF THE INVENTION

1. Field of the Invention

The present invention relates to an imageable element having an imaging layer comprising aromatic diazonium salt containing compounds and a method of producing the same. More particularly, the present invention relates to an imageable element, which comprises an aromatic diazonium salt containing compound having an alkoxy substituent and an aromatic diazonium salt containing compound free of an alkoxy substituent.

2. Description of the Prior Art

Lithography is the process of printing from specially prepared surfaces, some areas of which are capable of accepting lithographic ink, whereas other areas, when moistened with water, will not accept the ink. In the art of photolithography, a photographic material is made imagewise receptive to oily inks in the photo-exposed (negative-working) or in the non-exposed areas (positive-working) on a hydrophilic background. The areas which accept ink form the printing image areas and the ink-rejecting areas form the background areas.

In the production of common lithographic printing plates, also called surface litho plates or planographic printing plates, a support that has affinity to water or obtains such affinity by chemical treatment is coated with a thin layer of a photosensitive composition. Negative-working coatings for that purpose include light-sensitive polymer layers containing diazonium salt compounds, dichromate-sensitized hydrophilic colloids and a large variety of synthetic photopolymers, particularly diazonium salt condensates, which are widely used. Upon image-wise exposure of the light-sensitive layer the exposed image areas become insoluble and the unexposed areas remain soluble. The plate is then developed with a suitable liquid to remove the photosensitive composition from the unexposed areas.

Common difficulties encountered by practitioners of lithography include the poor solubility of the layer components in the solvents selected for the preparation of the coating solutions, insufficient differentiation between the image areas and the non-image areas, poor developability and resulting undesirable scumming during printing, low practical light-sensitivity, poor adhesion of the imaging layer, including low resistance to delamination under humid conditions, poor resistance to press chemicals and short press life.

U.S. Pat. Nos. 3,867,147 and 3,849,392, disclose synthesis of mixtures of diazonium salt condensates and copolymers, which contain both methoxy- and non-methoxy-diazonium salt groups. Polyvinyl acetal binders, having acid groups, are also disclosed. However, this patent does not disclose mixtures of methoxy- and non-methoxy-diazonium salt condensates, nor does it disclose the effect of the condensates on presslife and resistance to press chemicals.

U.S. Pat. No. 4,533,620 discloses copolymers which contain both methoxy- and non-methoxy-diazonium salt groups. It does not disclose mixtures of the corresponding methoxy- and non-methoxy-diazonium salt condensates.

European Patent Application No. 896,251 discloses a method and apparatus for making a lithographic plate in which, following imaging, a single developing fluid is utilized. The examples utilize mixtures of methoxy- and non-methoxy-diazonium salt condensates. However, the weight ratio of methoxy- to non-methoxy-diazonium salt condensates is less than one, corresponding to a calculated molar ratio of less than 0.9 with the same anions. The disclosed binders include polymethyl methacrylate dispersion in 98% hydrolyzed polyvinyl acetate and polyvinyl alcohol.

European Patent Application No. 902,325 claims a mixture of two diazo resins having an inorganic acid anion as the counter anion for one of the diazo resins and an aliphatic or aromatic organic acid anion for the other. The use of a polyurethane binder is also disclosed. One of the examples utilizes a mixture of methoxy- and non-methoxy-diazo resin with a methoxy to non-methoxy diazo resin weight ratio of 0.43:1, which corresponds to a calculated molar ratio of 0.3:1.

U.S. Pat. Nos. 5,846,685 and 4,408,532 disclose light sensitive compositions and lithoplate compositions based on diazonium salt condensates, including binders and substrates.

None of the above references discloses an imaging layer having an aromatic diazonium salt containing compound having an alkoxy substituent and an aromatic diazonium salt containing compound free of an alkoxy substituent.

Accordingly, it is an object of the present invention to provide an imaging layer based on a mixture of an aromatic diazonium salt containing compound having an alkoxy substituent and an aromatic diazonium salt containing compound free of an alkoxy substituent, which does not have the above-mentioned drawbacks and which has good storage properties, superior press life and resistance to plate chemicals.

SUMMARY OF THE INVENTION

In broad concept, the present invention includes an imageable element selected from the group consisting of: a first and a second imageable element;

said first imageable element comprising an imaging layer which comprises: an aromatic diazonium salt containing compound having an alkoxy substituent and an aromatic diazonium salt containing compound free of an alkoxy substituent; a polyvinyl acetal binder; and a sheet substrate; and said second imageable element comprising an imaging layer which comprises: an aromatic diazonium salt containing compound having an alkoxy substituent and an aromatic diazonium salt containing compound free of an alkoxy substituent; and a sheet substrate;

wherein said imaging layer comprises a total aromatic diazonium salt containing compound content of at least 10 weight percent; and wherein the molar ratio of said aromatic diazonium salt containing compound having an alkoxy substituent to said aromatic diazonium salt containing compound that is free of an alkoxy substituent is from about 1.0:1 to 70:1.

In one aspect, the present invention includes an imageable element having an imaging layer which comprises an aromatic diazonium salt containing compound having an alkoxy substituent and an aromatic diazonium salt containing compound free of an alkoxy substituent; a polyvinyl acetal binder; and a sheet substrate.

In another aspect, the present invention includes an imageable element comprising: an imaging layer comprising an aromatic diazonium salt containing compound having an alkoxy substituent and an aromatic diazonium salt containing compound free of an alkoxy substituent; and a sheet substrate; wherein said imaging layer comprises a total aromatic diazonium salt containing compound content of at least 10 weight percent; and that the ratio of said aromatic diazonium salt containing compound having an alkoxy substituent to said aromatic diazonium salt containing compound that is free of an alkoxy substituent is from about 1.0:1 to 70:1.

The present invention also includes a method of producing an imaged element comprising the steps of:

providing an imageable element selected from the group consisting of a first and a second imageable element; said first imageable element comprising an imaging layer which comprises an aromatic diazonium salt containing compound having an alkoxy substituent and an aromatic diazonium salt containing compound free of an alkoxy substituent; a polyvinyl acetal binder; and a sheet substrate; and said second imageable element comprising an imaging layer comprising an aromatic diazonium salt containing compound having an alkoxy substituent and an aromatic diazonium salt containing compound free of an alkoxy substituent and a sheet substrate; wherein said imaging layer comprises a total aromatic diazonium salt containing compound content of at least 10 weight percent; and wherein the molar ratio of said aromatic diazonium salt containing compound having an alkoxy substituent to said aromatic diazonium salt containing compound that is free of an alkoxy substituent is from about 1.0:1 to 70:1;

imagewise exposing said imageable element to radiation to produce exposed and unexposed regions; and contacting said imagewise exposed radiation-imageable element and a developer to selectively remove said unexposed regions.

This method can be used to prepare an imaged element according to the present invention.

The present invention further includes a photosensitive composition comprising: a synergistic mixture of an aromatic diazonium salt containing compound having an alkoxy substituent and an aromatic diazonium salt containing compound free of an alkoxy substituent; and a polyvinyl acetal binder.

The present invention still further includes a a photosensitive composition comprising: a synergistic mixture of an aromatic diazonium salt containing compound having an alkoxy substituent and an aromatic diazonium salt containing compound free of an alkoxy substituent; wherein the molar ratio of said alkoxy-substituted aromatic diazonium salt to said aromatic diazonium salt free of an alkoxy substituent is from about 1.0:1 to about 70:1.

The imageable element and the printing plates prepared therefrom according to the present invention employing a combination of counter anions are shown to produce enhanced developability and presslife in direct lithographic printing, i.e. direct litho, even after storage of the plates at high temperature and humidity.

The imageable element according to the present invention provides superior press life and chemical resistance to plate chemicals relative to either the corresponding methoxy or non-methoxy aromatic diazonium salt containing compound alone. Thus, the mixture of the methoxy and nonmethoxy aromatic diazonium salt containing compounds is a synergistic composition which provides an unexpected synergistic effect.

DETAILED DESCRIPTION OF THE INVENTION

An imageable element according to the present invention which has an imaging layer comprising a mixture of aromatic diazonium salt containing compound having an alkoxy substituent and an aromatic diazonium salt containing compound free of an alkoxy substituent according to the present invention provides superior press life and chemical resistance to plate chemicals relative to either the corresponding methoxy or non-methoxy diazo resins alone. Thus, the mixture of aromatic diazonium salt containing compound having an alkoxy substituent and an aromatic diazonium salt containing compound free of an alkoxy substituent according to the present invention is a synergistic composition which provides an unexpected synergistic effect.

In one aspect, the present invention includes a photosensitive composition comprising: a synergistic mixture of an aromatic diazonium salt containing compound having an alkoxy substituent and an aromatic diazonium salt containing compound free of an alkoxy substituent; and a polyvinyl acetal binder. In this embodiment, the molar ratio of alkoxysubstituted diazonium cation to non-alkoxy-substituted diazonium cation is from about 0.7:1 to about 70:1. Preferably, the ratio is from about 1.0:1 to about 70:1, more preferably from about 1.2:1 to 70:1 and most preferably from about 2.5:1 to about 40:1. The polyvinyl acetal binder preferably comprises a solubilizing group, which is preferably a carboxylic acid group.

In another aspect, the present invention includes a photosensitive composition comprising: a synergistic mixture of an aromatic diazonium salt containing compound having an alkoxy substituent and an aromatic diazonium salt containing compound free of an alkoxy substituent; wherein the mixed diazonium salt containing compounds comprise at least 10 wt % of the composition, preferably at least 15 wt % of the composition. In this case, the molar ratio of alkoxy-substituted diazonium cation to nonalkoxy-substituted diazonium cation is from about 1.0:1 to about 70:1. Preferably, the ratio is from about 1.2:1 to 70:1, more preferably from about 2.5:1 to about 40:1.

The alkoxy-substituted aromatic diazonium salt containing compound of the present invention is the condensation product of an alkoxy-substituted aromatic diazonium salt and a condensation agent preferably selected from the group consisting of: formaldehyde, bis-(alkoxymethyl) diphenyl ether, such as, bis-(methoxymethyl) diphenyl ether, and a combination thereof Other condensation agents that are suitable for use in the present invention are the condensation agents described in the previously incorporated U.S. Pat. No. 3,867,147.

Preferably, the alkoxy-substituted aromatic diazonium salt is 3-methoxy-4-diazodiphenylamine sulfate. However, any methoxysubstituted aromatic diazonium salt can be used. The counter anion of the aromatic diazonium salt containing an alkoxy substituent or is free of an alkoxy substituent can be any suitable counter anion. Exemplary of such counter anions are: toluene sulfonate, mesitylene sulfonate, sulfate, tetrafluoroborate, hexafluorophosphate, hexafluoroantimonate, hexafluoroarsenate, methanesulfonate, trifluoromethane sulfonate, naphthalene sulfonate and alkyl derivatives, zinc chloride, tetraarylborate, alkyltriarylborate, 2-hydroxy-4-methoxybenzophenone-5-sulfonate and dihydrogen phosphate.

The alkoxy-substituted or alkoxy free aromatic diazonium salts preferably have a diarylamine diazonium salt structure, more preferably a diphenylamine diazonium salt structure, with various substituents attached to either of the aromatic rings. Thus, in addition to one or more alkoxy groups, the alkoxy-substituted aromatic diazonium salt can have one or more of other substituents. The alkoxy free aromatic diazonium salt also can have one or more non-alkoxy substituents, provided that the resulting structure remains alkoxy free.

Exemplary of alkoxy substituents which may be linked to either of the aromatic nuclei of the diarylamine diazonium salt to produce an alkoxy-substituted aromatic diazonium salt include: methoxy, difluoromethoxy, ethoxy, hydroxyethoxy and ethoxyethoxy.

Examples of the non-alkoxy substituents which may be linked to the aryl nuclei of the diarylamine diazonium group in addition to one or more alkoxy substituents include: methyl, propyl, isobutyl, trifluoromethyl, fluorine, chlorine, bromine, iodine, amidocarbonyl, phenoxycarbonyl, acetyl, methanesulfonyl, ethanesulfonyl, acetylamino, methylamino, ethylamino, dimethylamino, diethylamino, methylethylamino, phenylamino, benzylamino, methylbenzylamino and ethylbenzylamino.

Suitable alkoxy containing diphenylamine-4-diazonium salts include, for example, the diazonium salts derived from the following amines: 4-amino-3-methoxydiphenylamine, 4-amino-2-methoxydiphenylamine, 4'-amino-2-methoxydiphenylamine, 4'-amino-4methoxydiphenylamine, 4-amino-3-ethoxydiphenylamine, 4-amino-3-hexyloxydiphenylamine, 4-amino-3-.beta.-hydroxyethoxydiphenylamine, 4'-amino-2-methoxy-5-methyldiphenylamine, 4-amino-3-methoxy-6-methyldiphenylamine, 4'-amino-4-n-butoxydiphenylamine and 4'-amino3',4-dimethoxydiphenylamine.

Preferred are the 3-alkoxy-4-aminodiphenylamines having 1 to 3 carbon atoms in the alkoxy group and 3-methoxy-4-aminodiphenylamine.

Examples of the methoxy-substituted aromatic diazonium salts include, but are not limited to, the following: 2,3',5-trimethoxydiphenyl-4-diazonium chloride; 2,4',5-triethoxydiphenyl-4-diazonium chloride; 4-(3-(3methoxyphenyl)-propylamino)-benzenediazonium sulfate; 4-(N-ethyl-N-(4methoxybenzyl)-amino)-benzenediazonium chloride; 4-(N-(naphthyl-(2)methyl)-N-n-propylamino)methoxybenzenediazonium sulfate, 4-(N-(3phenoxypropyl)-N-methylamino)-2,5-dimethoxybenzenediazonium tetrafluoroborate; 4-(N-(3-phenylmercaptopropyl)-N-ethylamino)-2-chloro-5-methoxybenzenediazonium chloride; 4-(4-(3-methylphenoxy)-phenoxy)-2,5-dimethoxybenzenediazonium sulfate; 4-(4-methoxy-phenylmercapto)-2,5-diethoxybenzenediazonium chloride; 2,5-diethoxy-4phenoxybenzenediazonium chloride; 4-(3,5-dimethoxybenzoylamino)-2,5-diethoxybenzenediazonium hexafluorophosphate; methoxycarbazole-3diazonium chloride; 3-methoxy-diphenyleneoxide-2-diazonium chloride and methoxydiphenylamine-4-diazonium sulfate.

A person of ordinary skill in the art would know how to use other aromatic methoxy-containing compounds and other counter anions to obtain a alkoxy-substituted aromatic diazonium salt containing compound that is suitable for use in the imaging layer of the present invention.

Preferably, the counter anion of the aromatic diazonium salt containing compound having an alkoxy substituent can be mesitylene sulfonate, toluene sulfonate, methane sulfonate, naphthalene sulfonate, trifluoromethane sulfonate, hexafluorophophate and tetrafluoroborate.

Similarly, the alkoxy-free aromatic diazonium salt containing compound of the present invention is the condensation product of an aromatic diazonium salt, which is free of an alkoxy substituent, and a condensation agent preferably selected from the group consisting of: formaldehyde, bis-(alkoxymethyl) diphenyl ether and a combination thereof. Other condensation agents that are suitable for use in the condensation agents described in the previously incorporated U.S. Pat. No. 3,867,147.

Preferably, the alkoxy-free aromatic diazonium salt is 4-diazodiphenylamine sulfate. However, any alkoxy-free aromatic diazonium salt can be used. Examples of such alkoxy-free aromatic diazonium salts include: diphenyl-4-diazonium chloride; 2-4-(N-(naphthyl2-methyl)-N-propylamino)benzenediazonium sulfate; chloro-diphenyl-4diazonium chloride; 4-(3-phenylpropylamino)-benzenediazonium sulfate; 4-(N-ethyl-N-(benzyl)-amino)-benzenediazonium chloride; 4-(N,N-dmethylamino)-benzenediazonium tetrafluoroborate; 4-(N-(3-phenylmercaptopropyl)-N-ethyl-amino)-2-chlorobenzenediazonium chloride; 4-(4methylphenoxy)benzenediazonium sulfate; 4-(phenylmercapto)-benzenediazonium chloride; 4-phenoxybenzenediazonium chloride; 4-(benzoylamino)-benzenediazonium hexafluorophosphate; methylcarbazole-3-diazoniumchloride; 3-methyldiphenyleneoxide-2diazoniumchloride and 3-methyldiphenylamine-4-diazonium sulfate.

Suitable alkoxy free diarylamine-4-diazonium salts, i.e., diphenylamine-4-diazonium salts, include, for example, the diazonium salts derived from the following amines: 4-amino-diphenylamine, 4-amino-3-methyl-diphenylamine, 4-amino-3-ethyldiphenylamine, 4'-amino-3-methyldiphenylamine, 4'-amino-4-methyldiphenylamine, 4'-amino-3,3'-dimethyldiphenylamine, 3'-chloro-4-aminodiphenylamine, 4-aminodiphenylamine-2-sulfonic acid, 4-aminodiphenylamine-2-carboxylic acid, 4-aminodiphenylamine-2'-carboxylic acid and 4'-bromo-4-aminodiphenylamine.

Preferably employed are 4-amino-diphenylamine and 3-methyl-4-aminodiphenylamine.

As above, a person of ordinary skill in the art would know how to use other aromatic alkoxy free compounds and other counter anions to obtain an alkoxy free aromatic diazonium salt containing compound that is suitable for use in the imaging layer of the present invention.

Preferably, the counter anion of the alkoxy-free aromatic diazonium salt containing compound can be toluene sulfonate, mesitylene sulfonate, 2-hydroxy-4-methoxybenzophenone-5-sulfonate, methane sulfonate, naphthalene sulfonate, trifluoromethane sulfonate, hexafluorophophate and tetrafluoroborate.

In a preferred embodiment, the molar ratio of the alkoxy-substituted aromatic diazonium salt to the aromatic diazonium salt free of an alkoxy substituent is from about 0.7:1 to about 70:1. Preferably, the diazonium salt containing compounds comprise at least 10 wt % of the imaging composition.

A plurality of compounds are suitable as the condensation agent in the preparation of the condensates derived from alkoxy-substituted aromatic diazonium salts and the alkoxy free aromatic diazonium salts.

An important class includes the substituted and unsubstituted aromatic hydrocarbons and aromatic heterocyclic compounds. Examples of unsubstituted aromatic isocyclic and heterocyclic compounds which may be used as components include, e.g., benzene, naphthalene, anthracene, phenanthrene, pyrene, indene, fluorene, acenaphthene, thiophene, furan, benzofuran, diphenylene oxide, benzothiophene, acridine, carbazole, phenothiazine, and others which may be substituted by one or more of the following groups: alkyl of 1 to 20 carbon atoms, aryl of 6 to 20 carbon atoms, aralkyl of 7 to 20 carbon atoms, alkaryl of 7 to 20 carbon atoms, alkoxy, alkoxymethyl, amino, alkylamino, dialkylamino, alkylaminomethyl, dialkylaminomethyl, amido, alkylthio, alkylthiomethyl, hydroxy, acyloxy and acyloxymethyl. The aryl nucleus may carry additional substituents.

According to the above, the condensation agent belongs to the following groups of substances, for example: aromatic compounds (iso- and heterocyclic), unsubstituted aromatic amines, phenols, thiophenols, phenol ethers, thiophenol ethers, diphenyl ethers, dithiophenyl ethers, aromatic compounds substituted by alkyl, aralkyl or aryl groups, urea, thiourea, carboxylic acid amides (aliphatic and aromatic), and sulfonic acid amides (aliphatic and aromatic).

Generally preferred are the condensation agents which have a molecular weight of less than 500, preferably less than 250, amines being calculated as free amines, not in the salt form, and acid groups being calculated in the H-form. If the compounds are aromatic compounds, those compounds are preferred within these limits which contain not more than 4, preferably not more than 1 to 2, most advantageously 2, individual aromatic rings, either fused to each other or connected with each other, preferably by a hetroatom and/or intermediate members.

Generally, the short-chain alkyl and alkoxy groups, i.e., 1 to 4 carbon atoms, and the smaller aromatic radicals in aryl and aralkyl groups, i.e., up to 12 carbon atoms, are preferred, because the corresponding compounds are more easily soluble in the condensation media so that the condensation can be performed more easily.

Exemplary of compounds that are particularly suitable are those which are derived from diphenyl ether, diphenyl sulfide, diphenyl methane, or diphenyl, and may contain one or two substituents selected from halogen atoms, alkyl groups, and alkoxy and alkoxyalkyl groups.

When the condensation agents are condensed with a diazonium salt, such as, unsubstituted diphenylamine-4-diazonium salts or alkoxy substituted diphenylamine-4-diazonium salts, condensates are obtained which can be readily precipitated and in good yields in the form of the salts, for example, of hydrochloric acid, hydrobromic acid, or of suitable sulfonic acids, depending on the desired counter anion to be present in the final condensation product.

The condensates produced by this method are either alkoxy substituted condensates or are condensates that are free of alkoxy substituents, i.e., alkoxy-free condensates. The alkoxy substituted and the alkoxy-free condensates are then blended to produce the compositions of the present invention, which comprise an aromatic diazonium salt containing compound having an alkoxy substituent and an aromatic diazonium salt containing compound free of an alkoxy substituent. A blend of alkoxy substituted and the alkoxy-free condensate is then used in the preparation of the imaging layer.

It should be pointed out that the diazonium condensate of the present invention is not a single condensate prepared by condensing a mixture of an alkoxy substituted diazonium salt and an alkoxy-free diazonium salt with a condensing agent to produce a diazonium condensate that is a "mixed" condensate derived from a mixture of an alkoxy substituted diazonium salt and an alkoxy-free diazonium salt. Rather, the diazonium condensate of the present invention is a blend of a diazonium condensate obtained by condensing an alkoxy substituted diazonium salt to obtain an alkoxy substituted diazonium salt condensate with an appropriate condensing agent and, thereafter, blending the alkoxy substituted diazonium salt condensate with an alkoxy-free diazonium salt condensate prepared by condensing an alkoxy-free diazonium salt condensate with an appropriate condensing agent.

The molar ratio of alkoxy-substituted diazonium cation to nonalkoxy-substituted diazonium cation in the blends generally is from about 0.7:1 to about 70:1. Preferably, the ratio is from about 1.0:1 to about 70:1, more preferably from about 1.2:1 to 70:1 and most preferably from about 2.5:1 to about 40:1.

In general, alkoxy-substituted and alkoxy free diazonium salt containing compounds known to be useful in photosensitive compositions can be used in the present invention, including diazonium salts described in the previously mentioned U.S. Pat. No. 3,867,147. The diazonium salt containing compounds may be diazo adducts of a diazo resin with sulfonated acrylic polymers as disclosed in U.S. Pat. No. 5,846,685 and adducts of a diazo resin with sulfonated polyesters as disclosed in U.S. Pat. No. 4,408,532.

The diazonium salt condensates comprise at least 10 wt % of the total weight of the imaging layer. Preferably, the diazonium salt containing condensates comprise at least 15 wt % of the total weight of the imaging layer.

Preferably, the methoxy-substituted diazonium salt condensate is the polycondensation product of 3-methoxydiphenylamine-4-diazonium sulfate and 4,4'-bis-(methoxymethyl) diphenyl ether or an isomer thereof, isolated as an appropriate salt. The methoxy-substituted diazonium salt condensate is from about 10 wt % to about 60 wt % of the total weight of the imaging layer, preferably from about 20 wt % to about 40 wt %.

Preferably, the methoxy free diazonium salt condensate is from about 0.5 wt % to about 25% by wt of the total weight of the imaging layer, preferably from about 2 wt % to about 20 wt % of the total weight of the imaging layer. The methoxy free diazonium salt condensate is preferably the polycondensation product of diphenylamine-4-diazonium sulfate and formaldehyde, isolated as an appropriate salt.

In still another aspect of the present invention, the mixed diazo composition can be used with or without a binder. For example, adducts of diazonium salt condensates with sulfonated polymers can be used without a binder. Such diazonium adducts of diazonium resins with sulfonated acrylic polymers are described in U.S. Pat. No. 5,846,685, which is incorporated herein by reference. Adducts of diazonium resins with sulfonated polyesters are disclosed in U.S. Pat. Nos. 4,408,532 and 5,846,685, which are both incorporated herein by reference.

Any polymeric binder known to be useful in such negative working photosensitive compositions can be used. The binders usable in the imageable element of the present invention can include as a binder a polyvinyl acetal binder, a polyurethane binder, derived, for example, from an isocyanate-functional prepolymer or isocyanurate trimer, acrylate polymer binder, methacrylate polymer binder and a combination thereof. The polyvinyl acetal binder preferably contains solubilizing groups having a pKa value of about 14 or less. Solubilizing groups include carboxylic acids, sulfonic acids, phenols, sulfonamides, N-acylsulfonamides and N-acylurethanes. Preferably, the solubilizing groups are carboxylic acids.

Examples of the carboxy-functional polyvinyl acetal binders include common polymers that are either commercially available or can be synthsized. Examples of the commercially available binders include binders available from Diversitec under the trade name Polymer DT-1 and polyvinyl acetal polymer W, which can be prepared by the procedures described herein in Example 7. Other methods well-known in the art can also be used.

In addition to the carboxy-functional polyvinyl acetal binders, other binders can also be used. Examples of such binders include polyurethane prepolymer, which can be prepared by reacting a diol and one or more diisocyanates, such as, 2,4-tolylene diisocyanate, 2,6-tolylene diisocyanate, p-xylene diisocyanate, m-xylene diisocyanate, 4,4'diphenylmethane diisocyanate, 1,5-naphthalene diisocyanate, 3,3'-dimethylbiphenyl-4,4'-diisocyanate hexamethylene diisocyanate, trimethylhexamethylene diisocyanate, isophorone diisocyanate, 4-4'-methylenebis (cyclohexyl isocyanate), methylcyclohexane-2,4-diisocyanate, methylcyclohexane-2,6-diisocyanate and 1,3-bis(isocyanatomethyl) cyclohexane. The diol can have one or more of the following compounds: ethylene glycol, polyethylene glycol, propylene glycol, polypropylene glycol, neopentyl glycol and a mixture thereof.

Typically, the polyvinyl acetal is from about 30 wt % to about 80 wt % of the total weight of the imaging layer. Preferably, it is from about 35 wt % to about 50 wt % of the total weight of the imaging layer. Preferably the polyvinyl acetal has 10–60 mol % vinyl alcohol groups, 1–25 mol % vinyl acetate groups, 1–50 mol % vinyl acid groups, 0–60 mol % vinyl aromatic acetal groups and 0–70 mol % vinyl aliphatic acetal groups. Other binders, such as (meth) acrylates and polyurethanes may be utilized together with or in place of the polyvinyl acetal.

The substrate of the imageable element is typically an aluminum sheet. However, other materials that are commonly known to those skilled in the art can also be used. Suitable substrates include any sheet material conventionally used to prepare lithographic printing plates, including metals such as aluminum sheets; paper; paper coated on one or both sides with an alpha-olefin polymer such as polyethylene; acetate films such as polyvinyl acetate and cellulose acetate film; polyvinyl acetal film; polystyrene film; polypropylene film; polyester film such as polyethylene terephthalate film; polyamide film; polyimide film; nitrocellulose film; polycarbonate film; polyvinylchloride film; composite films such as polyester, polypropylene or polystyrene film coated with polyethylene film; metalized paper or films; metal/paper laminates; Perlon gauze; plates of magnesium, zinc, copper, anodized aluminum, electrochemically roughened aluminum, steel, and the like.

A preferred substrate for the imageable element of present invention is an aluminum sheet. The surface of the aluminum sheet may be treated with metal finishing techniques known in the art including physical roughening, electrochemical roughening, chemical roughening, anodizing, and silicate sealing and the like. If the surface is roughened, the average roughness (Ra) is preferably in the range from 0.1 to 0.8 µm, and more preferably in the range from about 0.1 to about 0.4 µm. The preferred thickness of the aluminum sheet is in the range from about 0.005 inch to about 0.020 inch.

The preferred aluminum substrate is electrochemically-grained and anodized aluminum, such as commonly used for lithographic printing plates. Anodized substrates can be prepared using sulfuric acid anodization, phosphoric acid anodization or a combination thereof. Other conventional anodization methods can also be used in the preparation of the anodized substrate of the present invention.

The surfaces of these materials can be subjected to a pretreatment, if necessary, using the surface treatment techniques known in the art to improve adhesion between the substrate and organic coatings.

The base sheet substrate may serve as the final support, or it may be an intermediate support from which the light-sensitive copying composition may be transferred, by lamination, onto the material to be processed.

In addition to the photosensitive layer, the imageable element can have additional layers, such as, an underlying layer. Thus, the imageable element of the present invention can further comprise a primer layer disposed between the sheet substrate and the imaging layer. A possible function of an underlying layer is to enhance developability of the imagewise unexposed areas.

The imageable element of the present invention can further have an overlying layer. A possible functions of an overlying layer is to prevent damage, such as scratching, of the surface layer during handling prior to imagewise exposure. The overlying layer should be soluble, dispersible or at least permeable to the developer.

Further, known plasticizers, adhesion promoters, dyestuffs, pigments, color couplers, flow control agents and/or UV absorbers can be added to the copying compositions of the invention. The type and quantity of such additives depend on the purpose for which the imageable element according to the present invention is intended for use. In any case, however, care must be taken that the substances added do not absorb an excessive proportion of the actinic light required for crosslinking and thus reduce the practical light-sensitivity of the composition.

Suitable plasticizers include dibutyl phthalate, diusooctyladipate, nitro esters, alkyl and aryl phosphate esters, chlorinated paraffins. Glycols or aliphatic polyols can also be added. If it is desired to ensure good storability under relative high atmospheric moisture conditions, the use of water-insoluble plasticizers is preferred.

Adhesion promoters are added in those cases where the light-sensitive copying compositions according to the invention are to be exposed to particular stress, as in the cases when they are to be used as photoresist materials. Suitable adhesion promoters include monomeric or polymeric organic silanes, nitrogen-containing heterocyclic compounds, such as those disclosed in U.S. Pat. Nos. 3,645,722, 3,622,234, and 3,827,908, heterocyclic mercaptan compounds, mercapto alkanoic acid anilides and mercapto alkanoic acid esters.

The imageable element according to the present invention can further contain dyestuffs and/or pigments, such as those mentioned in U.S. Pat. Nos. 3,218,167 and 3,884,693, which can serve to increase the contrast and also to harden the layer.

The printing plates, forms, screens, resists, and the like, are prepared in the customary manner from the appropriate materials. After exposure, the non-image areas of the layer, which have retained their solubility, are removed by treatment with a suitable developer, such as, an aqueous acid or base solution.

The imageable layer can be applied using the application methods known in the art. For example, the photosensitive composition can be dissolved in solvents, preferably organic solvents, and applied to an aluminum substrate, which has been preferably grained, anodized and post-treated. Graining (or roughening) can be accomplished by mechanical or electrochemical processes or by a combination of both processes. Preferred post-treatments include silication and polyvinyl phosphonic acid. Post-treatment with phosphate or phosphate/fluoride, followed by silication, can also be used.

After proper drying, the coating weight of the imaging layer preferably is in the range of about 0.2 to about 5.0 $g/m^2$, and more preferably in the range from about 0.7 to about 2.5 $g/m^2$.

The present invention also includes a method of producing an imaged element.

The method includes the steps of:

providing an imageable element according to the present invention, optionally including a binder;

imagewise exposing the imageable element to radiation to produce exposed and unexposed regions; and contacting the imagewise exposed radiation-imageable element and a developer to selectively remove the unexposed regions.

The imaging layer of the imageable element is negative-working. Preferably, the imaging layer is photosensitive so that the imageable element according to the present invention is photo-imageable. Thus, in the method of the present invention, the step of imagewise exposing the imageable element to radiation is carried out using ultraviolet radiation. Upon such imaging the developer solubility of the imaged area is decreased to allow differentiation between imaged and non-imaged areas upon development. Typically, the step of exposing the imageable element to ultraviolet radiation is carried out using a UV radiation source, such as a metal halide doped mercury lamp. Such radiation sources typically emit radiation in both the UV and visible spectral regions. Lasers as well as excimer lamps, having appropriate emission that overlaps with absorption of the diazonium salt compositions, may also be used.

Following imagewise exposure by analog or digital means, an imaged element having exposed areas and complimentary unexposed areas is obtained. The exposed plate precursor is developed with a developer capable of selectively removing the diazonium layer in the unexposed regions. The developer liquid is applied to the imageable element to produce an imaged element having ink receptive exposed areas and complimentary water receptive areas from which the photosensitive composition. Has been removed.

The aqueous developer composition is dependent on the nature of the imaging layer composition. Common components of aqueous developers include surfactants, chelating agents, such as salts of ethylenediamine tetraacetic acid, organic solvents, such as benzyl alcohol, ethylene glycol monomethyl ether, diacetone alcohol, butyl acetate, ethylene glycol methyl ether acetate, methyl isobutyl ketone and a mixture thereof, and alkaline components, such as organic amines, including alkanol amines, such as triethanol amine and methyl diethanol amine, inorganic metasilicates, organic metasilicates, hydroxides and bicarbonates. The pH of the aqueous developer is preferably within about 5 to about 14, depending on the nature of the composition of the imaging layer. The development can be performed by any known manner, for instance, by rubbing the plate surface with a developing pad containing the foregoing developer or by pouring the developer on the plate surface and then rubbing the surface with a developing brush in water.

Printing plates prepared according to the present invention, which contain a blend of alkoxy containing diazonium condensates and alkoxy free diazonium salt condensates, exhibit improved presslife as well as greater resistance to press chemicals. These improvements can be made without reducing shelf life relative to formulations that contain only the alkoxy diazonium salt condensates or the formulations that contain only alkoxy free diazonium salt condensates. Such improvements in presslife and resistance to press chemicals are unexpected and are the result of a synergistic effect produced by the use of the alkoxy substituted diazonium salt condensate and the alkoxy free diazonium salt condensate blends.

The imageable element according to the present invention is distinguished by a high practical light-sensitivity, good differentiation between image areas and non-image areas, high resolution, easy, scumfree development involving no environmental hazards, long printing runs, and good compatibility of the components of the imaging layer in the solvents selected for coating.

The invention is further described in the following examples, which are intended to be illustrative and not limiting.

EXAMPLE 1

A photosensitive composition containing both methoxy and nonmethoxy diazo resins was prepared as follows. Carboxy-functional polyvinyl acetal polymer DT-1 (available from Diversitec) (2.07 g), methoxy diazo resin P533/M (a condensation product of 3-methoxy-4-diazodiphenylamine sulfate with an isomeric mixture of bis-methoxymethyl-substituted diphenylethers, isolated as the mesitylene sulfonate salt, available from Diversitec) (1.95 g), non-methoxy diazo resin DSO-19 (a condensation product of 4-diazodiphenylamine sulfate and formaldehyde, isolated as the toluene sulfonate salt, available from PCAS) (0.5 g), phthalocyanine pigment (79S26C chips, available from Penn Color) (1.35 g) and metanil yellow (0.12 g) were formulated into a solvent mix of 2-methoxyethanol (57.6 g), 2-ethoxyethanol (26.3 g) and dimethylformamide (10.1 g). The photosensitive composition at 5.77% solids was applied to a lithographic aluminum plate substrate to provide an imageable member with coating weight of about 0.75 g/m$^2$ after drying. Prior to application of the coating, the aluminum substrate was mechanically and electrochemically grained, anodized in sulfuric acid and post-anodically treated with an aqueous silicate solution.

EXAMPLE 2

An imageable member was prepared, as described in Example 1, except that the non-methoxy diazo resin DSO-19 was not included in the photosensitive composition.

EXAMPLE 3

Each of the imageable members of Example 1 and 2 were imagewise exposed with a suitable radiation source and developed to provide imaged plates, which were run on a Didde Glazer web press. The imaged plate of Example 2 failed to provide acceptable images after about 40,000 impressions; whereas the plate of Example 1 continued to provide acceptable images for more than 100,000 impressions. The imaged plate of Example 1 contained methoxy to non-methoxy diazo resin in the weight ratio of about 3.9:1, corresponding to a molar ratio of methoxydiazonium cation to non-methoxydiazonium cation of about 2.9:1.

EXAMPLE 4

Imageable members, as described in Example 1, were prepared in which the weight ratio of methoxy (P533/M) to non-methoxy (DSO-19) diazo resin was varied as follows: 100:0, 75:25, 50:50 and 0:100, in which the total weight was constant. The resulting plates were evaluated for resistance to Kodak Polychrome Graphics plate cleaner and reconditioner. The imageable members, which contained both diazo resins at 75:25 and 50:50 levels exhibited good resistance to the plate cleaner; whereas the imageable members, which contained either methoxy or non-methoxy diazo resin only, exhibited poor resistance to the plate cleaner. This experiment demonstrates a synergistic effect of the diazo resin mixtures in the resistance to plate cleaner relative to either of the individual diazo resins.

EXAMPLE 5

The plate cleaner resistance tests of Example 4 were also carried out on imageable members in which methoxy diazo resin P533/M was replaced by diazo resin NW1769, which is a corresponding methane sulfonate salt, available from Clariant. Plate cleaner resistant tests were also carried out in which non-methoxy diazo resin DSO-19 was replaced by diazo resin 213/M, which is a corresponding mesitylene sulfonate salt, available from Diversitec. In all cases, mixtures of methoxy and nonmethoxy diazo resins exhibited better resistance to the plate cleaner than did either of the individual diazo resins, which demonstrates that the synergistic effect of the diazo resin mixtures is independent of the diazo resin anion.

EXAMPLE 6

A series of photosensitive compositions were prepared, in accordance with the procedure described in Example 1, which contained polyvinyl acetal polymer DT-1 (37 wt %), Butvar B98 (a polyvinyl butyral polymer from Monsanto) (10 wt %), phthalocyanine pigment 79S26C chips (15 wt %), metanil yellow (2 wt %) and diazo resin (36 wt %). The diazo resin composition was varies as follows: 100:0, 75:25, 50:50 and 0:100 in wt % of methoxy diazo resin P533/M to non-methoxy diazo resin DSO-19.

Imageable members of these photosensitive compositions were prepared, as described in Example 1, which were imagewise exposed, developed and run on a Didde Glazer web press, as described in Example 2. Press life was determined by the number of clean impressions obtained prior to the onset of loss of 2% dots, which was taken as a measure of plate wear. The imaged plates corresponding to the 100:0 and 0:100 methoxy to non-methoxy diazo compositions provided about 60,000 and 70,000 clean impressions, respectively. Whereas, the imaged plates corresponding to 75:25 and 50:50 methoxy to non-methoxy diazo resin mixture compositions provided about 120,000 and 100,000 clean impressions, respectively.

This experiment demonstrates a synergistic effect of the diazo resin mixtures in enhancing press life relative to either of the individual diazo resins. The weight ratios of 75:25 and 50:50 correspond to molar ratios of the diazonium salts of about 2.2:1 and 0.74:1, respectively. These results complement the synergistic effect of the diazo resin mixtures in the resistance to plate cleaner, described in Example 4.

EXAMPLE 7

A photosensitive composition containing both methoxy diazo and nonmethoxy diazo resins was prepared as follows. Carboxy-functional polyvinyl acetal polymer W (described below) (10 wt % in 2methoxyethanol) (21.9 g), methoxy diazo resin Nega 107 (a condensation product of 3-methoxy-4-diazodiphenylamine sulfate with an isomeric mixture of methoxymethyl-substituted diphenylethers, isolated as the mesitylene sulfonate salt, available from PCAS) (1.8 g), non-methoxy diazo resin DSO-19 (0.2 g), phthalocyanine pigment dispersed in polymer W (1:1 by wt) (83 wt % in 2-methoxyethanol) (5.4 g), 4-phenylazodiphenylamine (0.024 g) and phosphoric acid (0.035 g) were formulated into a solvent mix of methanol (45 mL), methyl ethyl ketone (25 mL) and 2-methoxyethanol (5.6 mL). After filtering, the photosensitive composition was applied to a lithographic aluminum plate substrate to provide an imageable member with coating weight of about 1.0 g/m$^2$ after drying.

Prior to application of the coating, the aluminum substrate was electrochemically grained, anodized in sulfuric acid and post-anodically treated with an aqueous polyvinyl phosphonic acid solution.

Carboxy-functional polyvinyl acetal polymer W was prepared as follows. Mowiol 8/88® (polyvinyl alcohol having about 21 wt % residual acetyl groups, available from Hoechst) is dissolved in water (225 mL) and 1-propanol (450 mL) in a 3-neck flask, equipped with cooler, stirrer and thermometer, by heating at 75° C. in a water bath. The solution was cooled to 60° C. and concentrated hydrochloric acid (10.2 mL) was added, followed by dropwise addition of a mixture of butyraldehyde (16.2 g) and acetaldehyde (9.9 g). The mixture was stirred for 4 hr at 60° C., followed by the addition of sodium carbonate (10.6 g in 50-mL water) and stirring for 30 min. The resulting mixture was slowly poured into an excess of water to cause precipitation of the intermediate polymer, which is isolated by filtration and drying in a rotary drying chamber for 24 hr at 40° C.

The intermediate polymer was shown to contain 28 wt % vinyl alcohol units. The intermediate polymer (100 g) was dissolved in dimethyl sulfoxide (1.5 L) with stirring, followed by the addition concentrated hydrochloric acid (10 g) and acetal H (the reaction product of maleic anhydride with 2-(N-methylamino)-acetaldehyde dimethyl acetal, described below) (43.4 g). After stirring at 60° C. for 24 hr, the polyvinyl acetal polymer W is isolated by precipitation in excess water, filtered and dried in a rotary drying chamber for 24 hr at 40° C. Polymer W was shown to have an acid number of 21.

Acetal H was prepared as follows. 2-(N-methylamino) acetaldehyde dimethyl acetal (360.6 g) was added dropwise to a solution containing maleic anhydride (301.5 g dissolved in 740 mL dry tetrahydrofuran) with cooling so that the temperature did not rise above 20° C. Subsequently, the mixture was refluxed for 30 min and the solvent was distilled off by means of a vacuum rotary evaporator to provide the acetal H as an oil, which crystallizes, in quantitative yield. Acetal H was shown to have an acid number of 253.

EXAMPLE 8

An imageable member was prepared, as described in Example 7, except that the amount of methoxy diazo resin Nega 107 was increased from 1.8 g to 1.95 g and the amount of non-methoxy diazo resin DSO-19 was reduced from 0.2 g to 0.05 g.

EXAMPLE 9

An imageable member was prepared, as described in Example 7, except that the amount of methoxy diazo resin Nega 107 was increased from 1.8 g to 2.0 g and the amount of non-methoxy diazo resin DSO-19 was reduced from 0.2 g to 0.0 g.

EXAMPLE 10

An imageable member was prepared, as described in Example 7, except that the amount of methoxy diazo resin Nega 107 was reduced from 1.8 g to 0.0 g and the amount of non-methoxy diazo resin DSO-19 was increased from 0.2 g to 2.0 g.

EXAMPLE 11

Each of the imageable members of Examples 7–10 was imagewise exposed with a dose of 150 mJ/cm$^2$, using a metal halide lamp (MH burner, available from W. Sack), developed to remove the unexposed regions, gummed and mounted on a sheet-fed offset press. The number of printed sheets without visible plate wear for Examples 7–9 were 130,000, 110,000 and 30,000, respectively, using a relatively abrasive ink. Example 10 was not press-tested owing to poor shelf life (described in Example 12).

The results demonstrate that the plates of Examples 7 and 8, which contain both methoxy and non-methoxy diazo resins exhibit substantially longer press life (about 4 times longer) than the plate of Example 9, which contains only the methoxy diazo resin. Examples 7 and 8 contain methoxy to non-methoxy diazo resin in the weight ratio of about 9:1 and 39:1, respectively, corresponding to molar ratios of methoxydiazonium cation to non-methoxydiazonium cation of about 6.7:1 and 29:1, respectively.

EXAMPLE 12

Photosensitivity, resolution and shelf life of Examples 7–10 were determined as follows. Each of the imageable members of Example 7–10 was exposed (incident dose of 300 mJ/cm2) through a silver film halftone step wedge having a tonal range of 0.15 to 1.95, graduated in incremental steps of 0.15, using a metal halide lamp (MH burner, available from W. Sack), followed by development to remove the unexposed portions.

Photosensitivity was determined by inking the exposed and developed plates using Kodak Polychrome Graphics Ink 904, followed by determination of the number of partially inked steps and completely inked steps. The number of partially inked steps of the plates from Examples 7–10 was 8, 8, 7 and 3; the corresponding number of fully inked steps was 3, 2, 3 and 1.

Resolution was determined from the micro line/micro gap values of 4/10, 4/10, 4/10 and 8/6 for Examples 7–10, respectively.

Shelf life was simulated and accelerated by storing the imageable members for 10 days in a humidity chamber at 40° C. and 80% relative humidity, prior to exposure, development and inking. The plates from Examples 7–9 provided a clean background; whereas the plate from Example 10 exhibited strong scumming.

These results demonstrate inferior photosensitivity, resolution and shelf life of Example 10, which contains only the non-methoxy diazo resin.

The present invention has been described with particular reference to the preferred embodiments. It should be understood that variations and modifications thereof can be devised by those skilled in the art without departing from the spirit and scope of the present invention. Accordingly, the present invention embraces all such alternatives, modifications and variations that fall within the scope of the appended claims.

What is claimed is:

1. A method of making an imageable element comprising the steps of:
    providing a substrate;
    applying onto the surface of the substrate a photosensitive composition comprising:
    a mixture of an aromatic diazonium salt containing compound having an alkoxy substituent and an aromatic diazonium salt containing compound free of an alkoxy substituent; and
    treating the photosensitive composition to form a layer that adheres to the surface of the substrate.

2. The method of claim 1, wherein the substrate comprises metals, polymeric films, papers, or laminates.

3. The method of claim 1, wherein the substrate comprises an aluminum sheet.

4. The method of claim 3, wherein the aluminum sheet is grained or anodized.

5. The method of claim 1, wherein the photosensitive composition is free of binders.

6. The method of claim 1, wherein treating the photosensitive composition to form a layer comprises drying the photosensitive composition.

7. The method of claim 1, wherein the aromatic diazonium salt containing compound having an alkoxy substituent is the condensation product of the alkoxy-substituted aromatic diazonium salt and formaldehyde, bis-(alkoxymethyl) diphenyl ether or a combination thereof.

8. The method of claim 7, wherein the condensation agent is a bis-(alkoxymethyl) diphenyl ether.

9. The method of claim 8, wherein the bis-(alkoxymethyl) diphenyl ether is bis(methoxymethyl) diphenyl ether.

10. The method of claim 7, wherein the aromatic diazonium salt containing compound having an alkoxy substituent is 3-methoxy-4-diazodiphenylamine sulfate.

11. The method of claim 1, wherein the aromatic diazonium salt containing compound having an alkoxy substituent is a mesitylene sulfonate salt.

12. The method of claim 1, wherein the aromatic diazonium salt containing compound free of an alkoxy substituent is the condensation product of the aromatic diazonium salt containing compound free of an alkoxy substituent and formaldehyde, bis(alkoxymethyl) diphenyl ether or a combination thereof.

13. The method of claim 12, wherein the aromatic diazonium salt containing compound free of alkoxy substituent is 4-diazodiphenylamine sulfate.

14. The method of claim 12, wherein the condensation agent is formaldehyde.

15. The method of claim 1, wherein the aromatic diazonium salt containing compound which is free of an alkoxy substituent is a toluene sulfonate salt.

16. The method of claim 1, wherein the molar ratio of the aromatic diazonium salt containing compound having an alkoxy substituent to the aromatic diazonium salt containing compound free of an alkoxy substituent is from about 0.7:1 to about 70:1.

17. The method of claim 1, wherein the diazonium salt containing compounds comprise at least 10 wt % of the photosensitive composition.

18. The method of claim 1, further comprising applying a primer layer between the substrate and the photosensitive composition.

19. The method of claim 1, wherein the photosensitive composition further comprises a binder.

20. The method of claim 19, wherein the binder is a vinyl acetal polymer, a urethane polymer, an acrylate polymer, a methacrylate polymer or combination thereof.

21. The method of claim 20, wherein the binder is a substituted vinyl acetal polymer comprising one or more solubilizing groups.

22. The method of claim 21, wherein the solubilizing group is a carboxylic acid, sulfonic acid, phenol, sulfonamide, N-acylsulfonamide, N-acylurethanes or a combination thereof.

23. The method of claim 21, wherein the solubilizing group is carboxylic acid.

24. The method of claim 20, wherein the urethane polymer is a reaction product of a diol monomer and one or more diisocyanate monomers.

25. The method of claim 24, wherein the diol comprises: ethylene glycol, polyethylene glycol, propylene glycol, polypropylene glycol, neopentyl glycol or a mixture thereof.

26. The method of claim 1, wherein the imageable element is insoluble after exposure to imaging radiation.

27. The method of claim 1, wherein the photosensitive composition further comprises plasticizers, adhesion promoters, dyestuffs, pigments, color couplers, flow control agents or UV absorbers.

* * * * *